(12) United States Patent
Blumhagen et al.

(10) Patent No.: US 9,971,005 B2
(45) Date of Patent: May 15, 2018

(54) METHOD AND MAGNETIC RESONANCE SYSTEM FOR FAT SATURATION

(71) Applicant: Siemens Aktiengesellschaft, München (DE)

(72) Inventors: Jan Ole Blumhagen, Erlangen (DE); Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 581 days.

(21) Appl. No.: 14/661,217

(22) Filed: Mar. 18, 2015

(65) Prior Publication Data
US 2015/0268317 A1 Sep. 24, 2015

(30) Foreign Application Priority Data
Mar. 18, 2014 (DE) .................. 10 2014 204 995

(51) Int. Cl.
G01R 33/48 (2006.01)
G01R 33/20 (2006.01)
G01R 33/56 (2006.01)
G01R 33/483 (2006.01)

(52) U.S. Cl.
CPC ......... G01R 33/4828 (2013.01); G01R 33/20 (2013.01); G01R 33/5607 (2013.01); *G01R 33/4835* (2013.01)

(58) Field of Classification Search
CPC .............. G01R 33/20; G01R 33/4828; G01R 33/4835; G01R 33/5607; G01R 33/4838
See application file for complete search history.

(56) References Cited

U.S. PATENT DOCUMENTS

| 2007/0052415 | A1 | 3/2007 | Asano | |
| 2008/0238421 | A1* | 10/2008 | Kitane | G01R 33/4828 324/307 |
| 2012/0194193 | A1 | 8/2012 | Rehwald et al. | |
| 2013/0088226 | A1* | 4/2013 | Miyazaki | G01R 33/5607 324/309 |
| 2013/0241552 | A1* | 9/2013 | Hirai | G01R 33/5607 324/309 |
| 2014/0084922 | A1* | 3/2014 | Fu | G01R 33/5607 324/309 |

OTHER PUBLICATIONS

Lauenstein et al., "Evaluation of Optimized Inversion-Recovery Fat-Suppression Techniques for T2-Weighted Abdominal MR Imaging," Journal of Magnetic Resonance Imaging, vol. 27 (2008), pp. 1448-1454.

* cited by examiner

*Primary Examiner* — Rishi Patel
(74) *Attorney, Agent, or Firm* — Schiff Hardin LLP

(57) ABSTRACT

In a method and a magnetic resonance (MR) system for fat saturation when acquiring MR data in a predetermined volume segment of an examination object (O), a flip angle is determined as a function of a predetermined requirement for a fat signal that is acquired by the magnetic resonance system in the volume segment, and an RF preparation pulse is emitted that has the determined flip angle. This is followed by emission of a SPAIR pulse, followed by acquisition of the MR data.

11 Claims, 5 Drawing Sheets

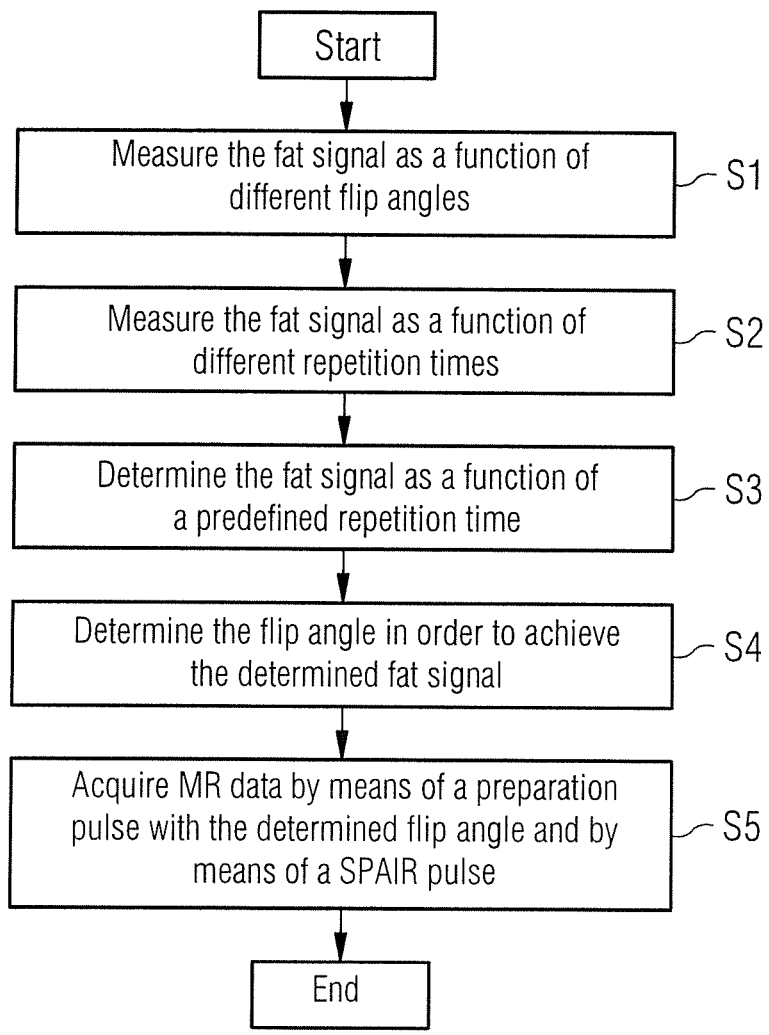

METHOD AND MAGNETIC RESONANCE SYSTEM FOR FAT SATURATION

BACKGROUND OF THE INVENTION

Field of the Invention

The present invention relates to a method and a magnetic resonance system, in order to perform fat saturation when acquiring MR data.

Description of the Prior Art

Several methods for fat saturation are known, including a method that operates with a so-called SPAIR pulse. The SPAIR pulse ("Spectrally Adiabatic Inversion Recovery") is a frequency-selective adiabatic inversion pulse that is emitted in order to invert only spins of the fat tissue. The actual RF excitation pulse is emitted a particular time period TI after the SPAIR pulse. Conventionally the time period TI is selected such that the longitudinal magnetization of the spins of the fat tissue has as little effect as possible when the MR data is acquired.

When the MR data are acquired in slices, significantly poorer fat saturation may occur as a function of particular measurement parameters in the case of a slice acquired first in time compared to the slices acquired subsequently in time. This different fat saturation then disadvantageously results in an inhomogeneous and disruptive intensity distribution of the fat signal within the reconstructed MR images.

An object of the present invention is to achieve fat saturation which is as homogeneous as possible when MR data is acquired in slices.

SUMMARY OF THE INVENTION

In accordance with the present invention a method is provided for fat saturation when acquiring MR data in a predetermined volume segment of an examination object with the operation of a magnetic resonance system. The method includes the following steps:

Determining a flip angle as a function of a predetermined requirement for a fat signal which is acquired by the magnetic resonance system in the volume segment when acquiring the MR data. This requirement for a fat signal corresponds to a requirement for fat saturation in the volume segment when acquiring the MR data.

Emitting an RF preparation pulse which has the flip angle.

Emitting the SPAIR pulse.

Acquiring the MR data.

The resulting fat signal or the resulting fat saturation depends principally on the selection of the flip angle. For this reason the requirement for the fat signal or fat saturation can be better met by setting the flip angle accordingly than is the case in comparable methods in accordance with the prior art.

The determination of the flip angle may here have the following substeps:

Measuring the fat signal for different flip angles. The present invention can be employed generally for three-dimensional MR data acquisition or for slice-based MR data acquisition. In slice-based MR data acquisition the fat signal is in particular measured for the first slice in time for different flip angles. However, according to the invention the fat signal can also be measured for the n-th slice in time for different flip angles.

As a function of the measurement a particular relationship is determined between the flip angle and the fat signal resulting therefrom. In slice-based MR data acquisition this relationship may be a function of the corresponding slice (in particular the first slice in time, but also the n-th slice in time).

Based on this particular relationship a flip angle is determined, with which the requirement for the fat signal or fat saturation can best be achieved.

The first slice in time or the n-th slice in time here corresponds to the first or n-th slice in time within a group of slices from which MR data is acquired with the same time period. This MR data or this group of slices is for example acquired in a single breath of the examination object (e.g. while the examination object is holding his breath).

If the requirement for the fat signal or fat saturation is a maximum fat saturation, the flip angle is determined on the basis of the previously determined relationship, such that the flip angle determined results in the smallest fat signal (i.e. in the maximum possible fat saturation).

To this end, the flip angle for which the smallest fat signal was measured when measuring the fat signal for different flip angles can for example be employed. Another possibility is to determine the flip angle for which the fat signal would have the smallest value, using the relationship, determined by measuring the fat signal for different flip angles, between the flip angle and the fat signal resulting therefrom.

According to a preferred embodiment, the MR data are acquired in slices, this also being known as two-dimensional MR data acquisition. When the MR data is acquired in slices, a respective SPAIR pulse is emitted prior to the MR data for the respective slice being acquired.

The RF preparation pulse is emitted before the SPAIR pulse, prior to the MR data for the first slice in time being acquired. Here the requirement for the fat signal or fat saturation is that the fat saturation of all slices be uniform.

In other words the flip angle of the RF preparation pulse is in this embodiment selected for the first slice in time, such that the fat saturation of the first slice in time corresponds to the fat saturation of the slices acquired subsequently in time. This means that advantageously an inhomogeneous intensity distribution of the fat signal is avoided in reconstructed MR images.

In this embodiment the determination of the flip angle can have the following substeps according to a first variant:

Measuring the fat signal for one or for several of those slices for which the MR data is acquired after the MR data for the first slice in time.

Determining the flip angle, such that the RF preparation pulse with this determined flip angle results in a fat signal for the first slice which corresponds to the measured fat signal.

In other words, for an arbitrary or for several arbitrary slices which are acquired at a time subsequent to the first slice in time, the fat signal or fat saturation is determined as a function of the sequence parameters (e.g. repetition time, inversion time TI). Then the flip angle for the RF preparation pulse of the first slice in time is selected such that for the first slice in time a fat signal or fat saturation results which corresponds to the previously determined fat signal or fat saturation of the arbitrary slice(s). The actual acquisition of the MR data with the sequence parameters is then performed with this flip angle.

In this embodiment the determination of the flip angle can also be performed in accordance with a second variant, which has the following substeps:

Measuring the fat signal for one or for several of those slices for which the MR data is acquired after the MR data of the first slice, for different repetition times. Compared to the first variant, the repetition times are accordingly varied in the second variant. The RF preparation pulse is emitted with a constant flip angle only before the first slice in time when measuring the fat signal, or the RF preparation pulse is not applied at all in this step.

Determining a relationship between the repetition time and the resulting fat signal or the resulting fat saturation as a function of the measurement of the fat signal in the previous step.

Based on a predefined repetition time, the fat signal or the fat saturation of the slice(s) is/are determined by the relationship determined in the previous step between the repetition time and the fat signal resulting therefrom.

The flip angle of the HR preparation pulse of the first slice in time is determined such that as a result the resulting fat signal or the resulting fat saturation of the first slice in time corresponds to the fat signal determined in the previous step.

The advantage of the second variant is that the relationship between the repetition time and the fat signal resulting therefrom or the fat saturation resulting therefrom need be determined only once. Then, based on this relationship, the flip angle of the RF preparation pulse for the first slice in time can be determined for every arbitrary sequence as a function of the predefined repetition time, without further measurements being necessary.

According to a preferred embodiment the determination of the relationship between the repetition time and the fat signal resulting therefrom or the fat saturation resulting therefrom comprises a determination of a minimum repetition time and a maximum repetition time. In this case the fat signal increases monotonically in a time range between the minimum repetition time and the maximum repetition time as the repetition time increases. The determination of the flip angle comprises the following steps according to this embodiment:

Measuring the fat signal of the first slice in time for different flip angles.

Determining a minimum flip angle and a maximum flip angle, the fat signal declining monotonically in an angular range between the minimum flip angle and the maximum flip angle as the flip angle increases.

Determining the flip angle as a function of the predefined repetition time on the basis of the following equation (1).

$$\alpha = -\frac{\alpha_{max} - \alpha_{min}}{TR_{max} - TR_{min}} \times (TR - TR_{min}) + \alpha_{max} \quad (1)$$

Here $\alpha_{min}$ or $\alpha_{max}$ corresponds to the minimum or maximum flip angle, $TR_{min}$ or $TR_{max}$ to the minimum or maximum repetition time, TR to the predefined repetition time and $\alpha$ to the flip angle to be determined of the RF preparation pulse of the first slice in time.

Equation (1) provides a simple option, based on the predefined repetition time TR, for determining the flip angle $\alpha$ of the RF preparation pulse of the first slice in time.

Whereas the RF preparation pulse is preferably emitted before the SPAIR pulse only before the first slice in time, it is also possible to emit the RF preparation pulse before the SPAIR pulse prior to the acquisition of the MR data for each slice. In this case the flip angle of the RF preparation pulses should each be set to the same flip angle. This constant flip angle is then selected such that it results in a minimum fat signal or in a maximum fat separation in the case of the first slice in time.

The purpose of the RF preparation pulse is to improve the fat saturation of the first slice in time, it being possible for this fat saturation by the RF preparation pulse to have a poorer outcome when the flip angle is selected incorrectly despite the RF preparation pulse than the fat saturation of the following slices in time, even if these following slices in time do not have any RF preparation pulse. Thanks to the inventive optimum selection of the flip angle of the RF preparation pulse of the first slice in time, the fat saturation of the first slice in time is in most cases better than the fat saturation of the subsequent slices in time. For this reason the fat saturation of the subsequent slices in time is now for its part improved, by the RF preparation pulse being emitted before the SPAIR pulse for each slice, each RF preparation pulse having the same flip angle for the sake of simplicity.

The present invention also encompasses a magnetic resonance system is also provided for fat saturation when acquiring MR data for a predetermined volume segment of an examination object. The magnetic resonance system has a basic field magnet, a gradient field system, at least one RF antenna and a control computer for actuating the gradient field system and the at least one RF antenna, for receiving measurement signals recorded by the RF antenna or RF antennas and for generating the MR data. The magnetic resonance system is designed such that the magnetic resonance system with its control device determines a flip angle as a function of a predetermined requirement for a fat signal which is acquired by the magnetic resonance system in the volume segment, or for fat saturation in the volume segment, and such that the at least one RF antenna emits an RF preparation pulse which has the flip angle, and a SPAIR pulse, in order to acquire the MR data.

The advantages of the inventive magnetic resonance system here essentially correspond to the advantages of the inventive method, which are explained in detail above.

Furthermore, the present invention encompasses a non-transitory, computer-readable data storage medium encoded with programming instructions, which can be loaded into a memory of a programmable controller or of a computing unit of a magnetic resonance system. The programming instructions cause the computer or processor to execute all or various previously described embodiments of the inventive method, when the programming instructions run in the controller or control computer of the magnetic resonance system. The storage medium may require other program means, e.g. libraries and auxiliary functions, in order to realize the corresponding embodiments of the method. The programming instructions may be in source code (e.g. C++), which must still be compiled and bound or which only has to be interpreted, or can be an executable software code, which for execution purposes only has to be loaded into the corresponding computing unit or control device.

The electronically readable data carrier can be, e.g., a DVD, a magnetic tape or a USB stick, on which electronically readable control information, in particular software (see above), is stored.

The present invention is employed, for example, in order to acquire a specified number of slices (e.g. 20 or 40), for example in the same breath. In this case, the time period TI for e.g. the first 5 slices of this concat (of the 20 to 40 slices) would be different (longer) than the time period for the remaining (15 to 35) slices. The same then applies to the next concat. In the next concat, the time period TI for the first slices will also be set differently from the time period TI for the remaining slices.

The present invention can be performed using single-shot methods, but also using multi-shot methods (here the MR data for the same slice is acquired with multiple RF pulses (in each case with a SPAIR pulse)).

The present invention achieves a significant improvement in fat saturation, in particular in single-shot acquisitions (e.g. HASTE ("Half fourier Acquisition Single shot Turbo spin Echo")), whereby it is not necessary to increase the measurement time, provided that the time gap between two RF excitation pulses adjacent in time is constant. This enables homogeneous fat saturation over the entire batch of slices.

The present invention is particularly suitable for fat saturation with the SPAIR pulse when acquiring the MR data in slices. The present invention is of course not restricted to this preferred area of application, since the present invention is at least in principle also suitable for fat saturation with a SPAIR pulse in three-dimensional (not slice-based) data acquisition.

The present invention is preferably employed with spin echo sequences, but can in principle also function with gradient echo sequences.

BRIEF DESCRIPTION OF THE DRAWINGS

FIG. 5 is a flow chart for the inventive method for fat saturation.

DESCRIPTION OF THE PREFERRED EMBODIMENTS

Figure 1:
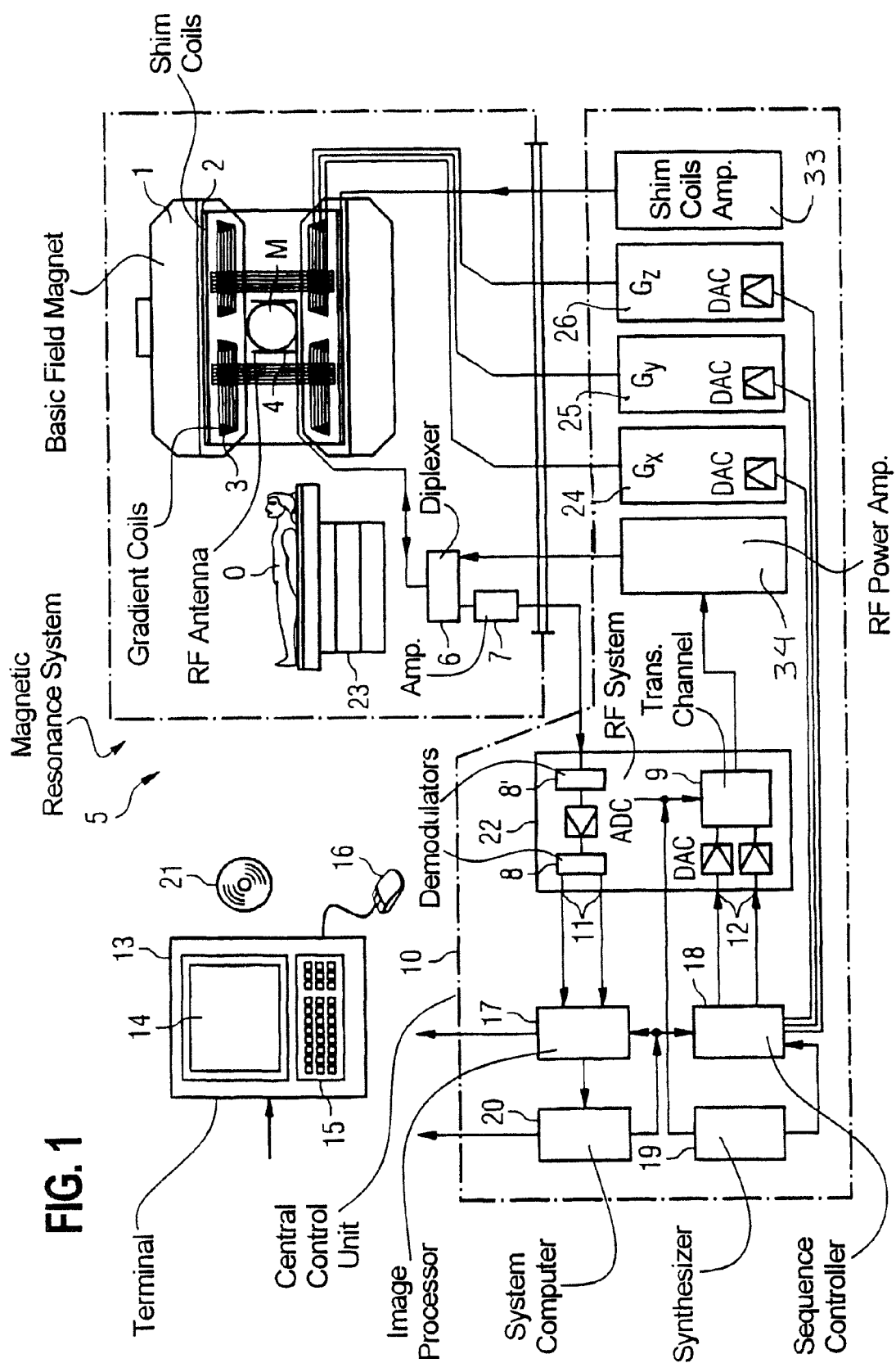
FIG. 1 schematically illustrates an inventive magnetic resonance system.

FIG. 1 is a schematic illustration of a magnetic resonance system 5 (a magnetic resonance imaging or nuclear spin tomography device). Here a basic field magnet 1 generates a strong magnetic field which is constant over time for polarization or orientation of the nuclear spins in an examination region of an object O, such as for example a part to be examined of a human body, which while lying on a table 23 is examined in the magnetic resonance system 5. The high level of homogeneity of the basic magnetic field needed for the nuclear spin resonance measurement is defined in a typically spherical measurement volume M, through which the parts to be examined of the human body are continuously pushed. To support the requirements for homogeneity and in particular to eliminate influences which are invariable over time the so-called shim sheets made of ferromagnetic material are attached at a suitable point. Influences which are variable over time are eliminated by shim coils 2, supplied with currently a shim coils amplifier 33.

A cylindrical gradient field system or gradient field system 3 is employed in the basic field magnet 1, and is composed of three such windings. Each such winding is supplied by an amplifier with current for generating a linear (also variable over time) gradient field in the respective direction of the Cartesian coordinates system. The first partial winding of the gradient field system 3 in this case generates a gradient $G_x$ in the x direction, the second partial winding a gradient $G_y$ in the y direction and the third partial winding a gradient $G_z$ in the z direction. The amplifier has a digital-to-analog converter which is triggered by a sequence controller 18 to generate properly timed gradient pulses.

Located within the gradient field system 3 is one (or more) radio-frequency antennas 4 which convert the radio-frequency pulses emitted by a radio-frequency power amplifier 34 into a magnetic alternating field for exciting the nuclei and orienting the nuclear spins of the object O to be examined or of the region of the object O to be examined. Each radio-frequency antenna 4 has of one or more RF transmitting coils and one or more RF receiving coils in the form of an annular, preferably linear or matrix-shaped, arrangement of component coils. The RF receiving coils of the respective radio-frequency antenna 4 also convert the alternating field emitted by the precessing nuclear spins, i.e. generally the nuclear spin echo signals produced by a pulse sequence comprising one or more radio-frequency pulses and one or more gradient pulses, into a voltage (measurement signal) which is fed via an amplifier 7 to a radio-frequency receiving channel 8 of a radio-frequency system 22. The radio-frequency system 22, which is part of a control device 10 of the magnetic resonance system 5, further has a transmitting channel 9 in which the radio-frequency pulses are generated for the excitation of the magnetic nuclear resonance. In this case the respective radio-frequency pulses are represented digitally in the sequence controller 18 as a sequence of complex numbers on the basis of a pulse sequence predefined by the system processor 20. This sequence of numbers is fed as a real part and an imaginary part via respective inputs 12 to a digital-to-analog converter in the radio-frequency system 22 and from this to a transmitting channel 9. In the transmitting channel 9 the pulse sequences are modulated up to a radio-frequency carrier signal, whose basic frequency corresponds to the resonance frequency of the nuclear spins in the measurement volume.

The switch from transmitting to receiving mode is effected by a transmit/receive diplexer 6. The RF transmitting coils of the radio-frequency antenna(s) 4 radiate the radio-frequency pulses into the measurement volume M to excite the nuclear spins and resulting echo signals are scanned via the RF receiving coil(s). The correspondingly obtained nuclear resonance signals are demodulated on a phase-sensitive basis to an intermediate frequency in the receiving channel 8' (first demodulator) of the radio-frequency system 22, digitized in the analog-to-digital converter (ADC) and emitted via the output 11. This signal is still demodulated to the frequency 0. The demodulation to the frequency 0 and the separation into real and imaginary parts takes place after digitization in the digital domain in a second demodulator 8. Using an image processor 17 an MR image is reconstructed from the measurement data obtained in this manner via an output 11. The administration of the measurement data, the image data and the control programs takes place via the system processor 20. On the basis of a parameter containing control programs the sequence controller 18 controls the generation of the respectively desired pulse sequences and the corresponding scanning of the K space. In particular the sequence controller 18 in this case controls the properly timed switching of the gradients, the transmission of the radio-frequency pulses with defined phase amplitude and the receipt of the nuclear resonance signals. The time basis for the radio-frequency system 22 and the sequence controller 18 is provided by a synthesizer 19. The selection of corresponding control programs for generating an MR image, which are stored for example on a DVD 21, and the display of the generated MR image are effected via a terminal 13 that has a keyboard 15, a mouse 16 and a monitor 14.

Figure 2:
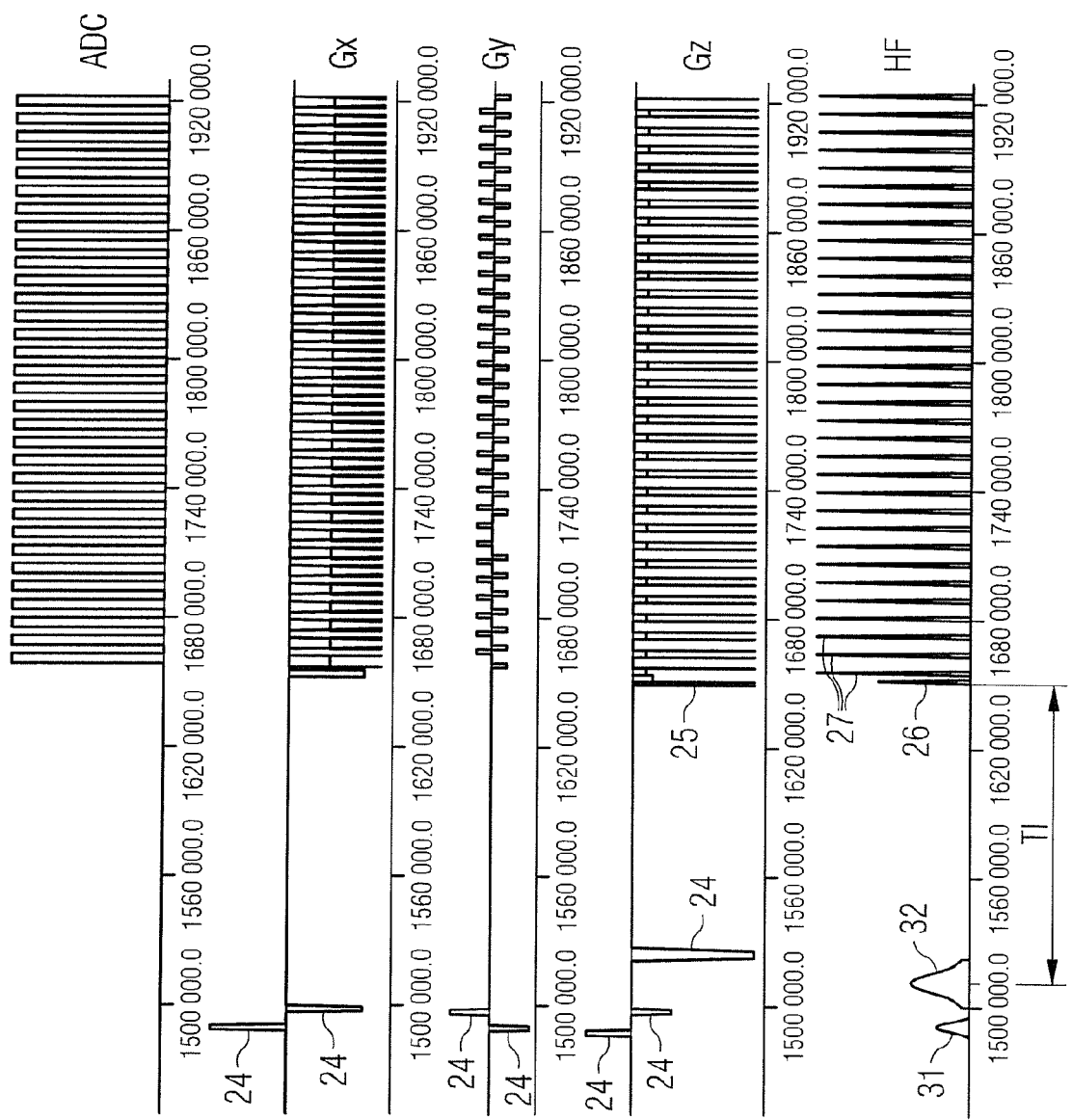
FIG. 2 shows an inventive sequence diagram for fat saturation and subsequent MR data acquisition.

In FIG. 2 an inventive sequence for acquiring MR data is illustrated. Initially an RF preparation pulse 31 is emitted, which is framed by gradients 24 (so-called spoilers) (i.e. the spoilers 24 are emitted before and after the RF preparation pulse 31 in time). These spoilers 24, which are optionally present in every spatial direction or gradient direction Gx, Gy, Gz, serve to destroy the magnetization in particular of the fat spins. After the RF preparation pulse 31 (i.e. more precisely after the spoilers 24 which are switched after the RF preparation pulse 31) the SPAIR pulse 32 is emitted, which is frequency-selective and as far as possible excites only the fat spins (i.e. the spins of the fat tissue) and tilts or inverts them by 180°. A residual transverse magnetization is then destroyed by a spoiler 24, which is emitted directly after the SPAIR pulse 32 only in the gradient direction Gz.

After a so-called inversion time TI, in which the fat magnetization is attenuated virtually to zero on the basis of the T1 relaxation, the MR data are acquired slice by slice. To this end an RF excitation pulse 26 is emitted in the case of a switched (activated) slice selection gradient 25. Then a refocusing pulse 27 is repeatedly emitted while a $G_z$ gradient is switched. Then a $G_y$ phase-encoding gradient is switched, before in the case of a switched Gx readout gradient a k-space line is read out. Due to this procedure numerous k-space lines are acquired, before further k-space lines of the same slice or in most cases of a different slice are acquired, starting with an emission of a new SPAIR pulse 32 and a new RF excitation pulse 26.

When k-space is filled (data entered therein) slice-by-slice, the RF preparation pulse 31 is generally emitted only to acquire the MR data for the slice acquired first in time of a so-called concat (i.e. a group of slices that are acquired consecutively in time with the same repetition time, for example in the same breath). It is however also possible to emit the RF preparation pulse 31 before further SPAIR pulses 32 or even before every SPAIR pulse 32, i.e. when acquiring the MR data for further slices or for each slice.

Figure 3:
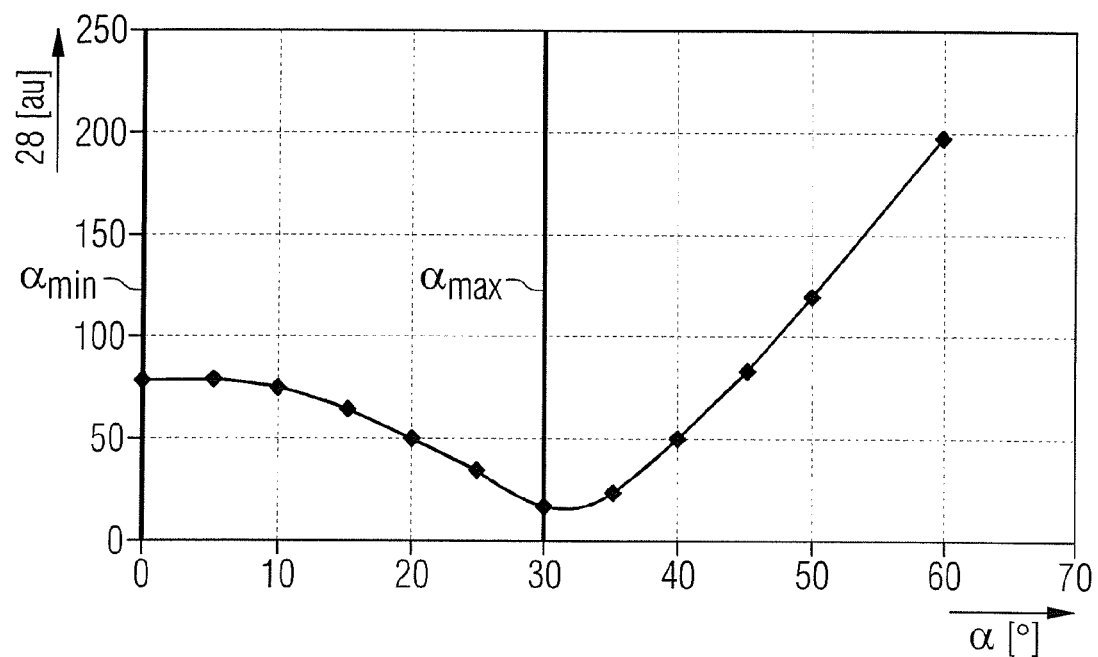
FIG. 3 shows a fat signal plotted with respect to the flip angle, in accordance with the invention.

In FIG. 3 the fat signal 28 is plotted against the flip angle α of the RF preparation pulse 31. The individual measurement points are determined by emitting an RF preparation pulse 31 with the corresponding flip angle α before the SPAIR pulse 32 in each case for the first slice in time of a concat, and then determining the fat signal on the basis of the acquired MR data. An essentially linear course of the fat signal 28 can be identified compared to the flip angle for a flip angle range from 0° ($α_{min}$) to approx. 30° ($α_{max}$). In this flip angle range from $α_{min}$ to $α_{max}$ the fat signal 28 decreases monotonically as the flip angle α increases.

On the basis of FIG. 3 it is also possible to determine the flip angle for which the fat signal is minimal and thus the fat saturation of the first slice of a concat is optimal. To this end the flip angle of the minimum of the function illustrated in FIG. 3 is determined. The flip angle determined in this way can then be set as the flip angle of the RF preparation pulse, it being possible to set this RF preparation pulse either only in the case of the first slice in time of a concat or else also in the case of each slice.

Figure 4:
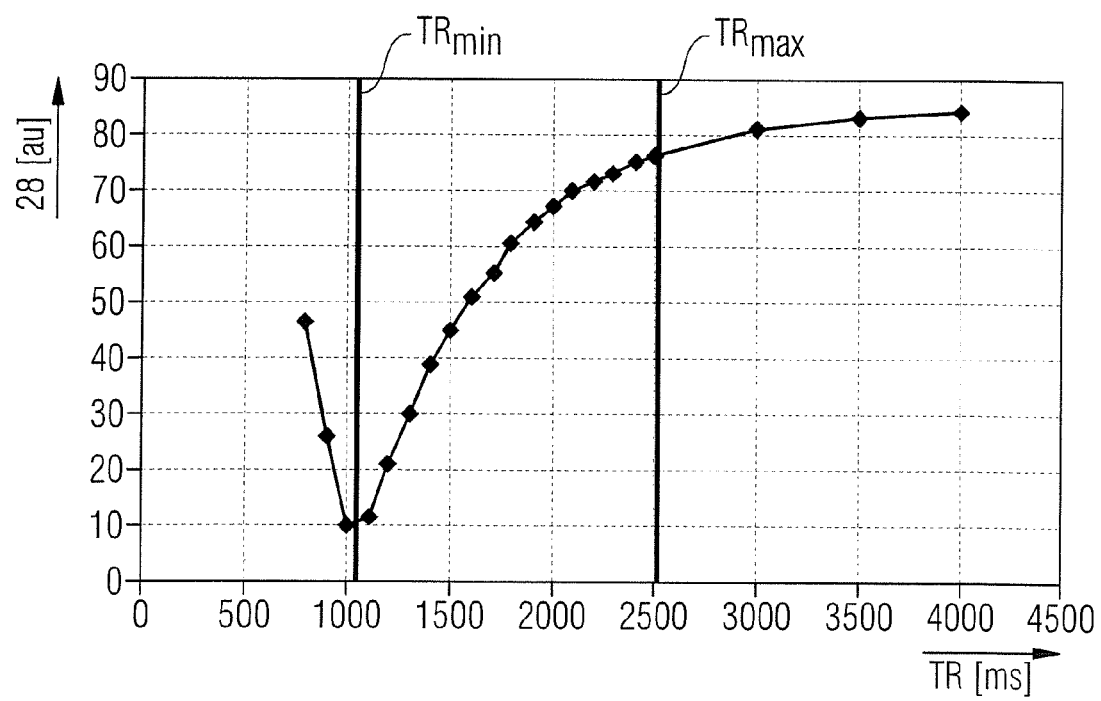
In FIG. 4 a fat signal is plotted with respect to the repetition time, in accordance with the invention.

In FIG. 4 the fat signal 28 is plotted against the repetition time TR. The individual measurement points are determined by acquiring the MR data by means of the corresponding repetition time TR for a particular slice for which the MR data was acquired later in time than the first slice in time and then determining the fat signal on the basis of the acquired MR data. An essentially linear course of the fat signal 28 can be identified against the repetition time TR for a time range from approx. 1.05 s ($TR_{min}$) to approx. 2.55 s ($TR_{max}$). Here it is precisely the clinically relevant repetition times which lie within this time range. In this time range from $TR_{min}$ to $TR_{max}$ the fat signal 28 increases monotonically as the repetition time TR increases.

Starting from the relationships determined using FIGS. 3 and 4 between the fat signal 28 and the flip angle α or the repetition time TR, the flip angle α can be approximately determined as a function of the repetition time TR in accordance with the equation (1) described above.

$$\alpha = -\frac{\alpha_{max} - \alpha_{min}}{TR_{max} - TR_{min}} \times (TR - TR_{min}) + \alpha_{max} \qquad (1)$$

If the flip angle α of the RF preparation pulse 31 of the first slice in time is set in accordance with equation (1), the fat signal or fat saturation of the first slice essentially corresponds to the fat signal or fat saturation of the slice on the basis of which the relationship between the fat signal 28 and the repetition time TR was determined.

The dependency of the fat signal on the repetition time TR is essentially identical for the slices of a concat which are acquired later in time than the first slice in time. Hence setting the flip angle α in accordance with equation (1) ensures that the fat saturation of the first slice in time corresponds to the fat saturation of all other slices of the concat, so that ultimately all slices of a concat have a uniform fat saturation.

In FIG. 5 the flow chart of an inventive method for fat saturation when acquiring MR data is illustrated.

In the first step S1 the fat signal of the first slice in time is measured as a function of different flip angles, whereas in the second step S2 the fat signal is measured as a function of different repetition times for a slice, the MR data of which is acquired later in time than the first slice in time. For a predefined repetition time the fat signal or fat saturation is determined in the third step S3 on the basis of the measurements performed in the previous step S2. In the following step S4 the flip angle is determined on the basis of the measurements performed in the first step S1 such that the previously determined fat signal or the previously determined fat saturation are achieved using the RF preparation pulse which has the determined flip angle. Then in step S5 the MR data is acquired with the aid of RF preparation pulses which have the determined flip angle and are each emitted before a SPAIR pulse.

Although modifications and changes may be suggested by those skilled in the art, it is the intention of the inventors to embody within the patent warranted hereon all changes and modifications as reasonably and properly come within the scope of their contribution to the art.

We claim as our invention:
1. A method for acquiring MR data, comprising:
from a control computer, operating an MR scanner, comprising a radio frequency (RF) coil arrangement and a gradient coil system, while an examination subject is situated in the MR scanner, to acquire an initial set of MR data comprising a fat signal from the examination subject;
in said control computer, automatically determining a flip angle as a function of a predetermined requirement for said fat signal;

from said control computer, operating the MR scanner to radiate an RF preparation pulse, having said flip angle, from said RF coil arrangement;

from said control computer, operating said MR scanner to radiate a Spectrally Adiabatic Inversion Recovery (SPAIR) pulse from said RF coil arrangement, after radiating said RF preparation pulse having said flip angle;

from said control computer, operating said RF coil arrangement and said gradient coil system of said MR scanner to acquire another set of MR data, again comprising said fat signal, from said examination subject, and, from said control computer, entering the acquired MR data into an electronic memory; and via said control computer, making the MR data stored in said electronic memory available in electronic form as a data file.

2. A method as claimed in claim 1 comprising determining said flip angle by:

from said control computer, operating said MR scanner to acquire said initial set of MR data with respective fat signals for respectively different flip angles;

in said control computer, determining a flip angle fat signal relationship between said fat signals and said different flip angles; and in said control computer, determining said flip angle as a flip angle that thus satisfies said predetermined requirement according to said flip angle fat signal relationship.

3. A method as claimed in claim 2 comprising using, in said control computer, maximum fat saturation as said predetermined requirement, and determining said flip angle as the flip angle that results in the smallest fat signal in accordance with said relationship.

4. A method as claimed in claim 1 comprising, from said control computer, operating said RF coil arrangement and said gradient coil system of said MR scanner to acquire said initial set of MR data from a plurality of slices of the examination subject and, before the MR data for each slice in said initial set of MR data are acquired, radiating a respective SPAIR pulse from said RF coil arrangement.

5. A method as claimed in claim 4 comprising, from said control computer, operating said MR scanner to radiate said RF preparation pulse from said RF coil arrangement before the MR data for each slice in said initial set of MR data are acquired and, in said control computer, setting said flip angle for a first of said plurality of slices to a flip angle value that results in a minimum fat signal in said MR data in said first slice in said initial set of MR data, and setting said flip angle for every other slice in said plurality of slices to the same flip angle value as said flip angle value for said first slice.

6. A method as claimed in claim 4 comprising, from said control computer, operating said MR scanner to radiate said RF preparation pulse from said RF coil arrangement before acquiring said MR data for a first slice in said plurality of slices in said initial set of MR data and, in said control computer, using, as said predetermined requirement, a requirement for uniform fat saturation over said plurality of slices.

7. A method as claimed in claim 6 comprising, in said control computer, measuring said fat signal in the MR data for at least one slice, among said plurality of slices, after said first slice in said initial set of MR data, and giving said flip angle a flip angle value that causes the fat signal of the MR data of the first slice in said initial set of MR data to correspond to said fat signal measured for said at least one other slice.

8. A method as claimed in claim 6 comprising, in said control computer, measuring the fat signal in MR data from at least one slice, among said plurality of slices, after said first slice in said initial set of MR data, for respectively different repetition times of acquisition of said MR data, and determining a repetition time fat signal relationship from the fat signal for said different repetition times, determining the fat signal of said at least one slice as a function of a predetermined repetition time, and giving said flip angle a flip angle value that causes said fat signal in said first slice to produce the fat signal determined for said predetermined repetition time.

9. A method as claimed in claim 8 comprising determining said repetition time fat signal relationship by determining a minimum repetition time and a maximum repetition time, among said different repetition times, wherein said fat signal increases monotonically with the repetition time in a repetition time range between said minimum and maximum repetition times, and determining said flip angle to have a flip angle value a by measuring said fat signal for a plurality of different flip angles in said initial set of MR data, determining a minimum flip angle and a maximum flip angle, wherein the fat signal decreases monotonically with the flip angle in a flip angle range between the minimum and maximum flip angles, and determining α according to $$\alpha = -\frac{\alpha_{max} - \alpha_{min}}{TR_{max} - TR_{min}} \times (TR - TR_{min}) + \alpha_{max}.$$

wherein TR is the repetition time, $TR_{min}$ is the minimum repetition time, $TR_{max}$ is the maximum repetition time, $\alpha_{max}$ is the maximum flip angle, and $\alpha_{min}$ is the minimum flip angle.

10. A magnetic resonance (MR) apparatus comprising:
an MR scanner comprising a radio frequency (RF) coil arrangement and a gradient coil system;
a control computer configured to operate the MR scanner, while an examination subject is situated in the MR scanner, to acquire an initial set of MR data comprising a fat signal from the examination subject;
said control computer being configured to automatically determine a flip angle as a function of a predetermined requirement for said fat signal;
said control computer being configured to operate the MR scanner to radiate an RF preparation pulse, having said flip angle, from said RF coil arrangement;
said control computer being configured to operate said MR scanner to radiate a Spectrally Adiabatic Inversion Recovery (SPAIR) pulse from said RF coil arrangement, after radiating said RF preparation pulse having said flip angle;
an electronic memory;
said control computer being configured to operate said RF coil arrangement and said gradient coil system of said MR scanner to acquire another set of MR data, again comprising said fat signal, from said examination subject, and to enter the acquired MR data into said electronic memory; and
said control computer being configured to make the MR data stored in said electronic memory available in electronic form as a data file.

11. A non-transitory, computer-readable data storage medium encoded with programming instructions, said storage medium being loaded into a control computer of a magnetic resonance (MR) apparatus, that comprises an MR scanner comprising a radio frequency (RF) coil arrangement and a gradient coil system, said programming instructions causing said control computer to:
- operate the MR scanner, while an examination subject is situated in the MR scanner, to acquire an initial set of MR data comprising a fat signal from the examination subject;
- automatically determine a flip angle as a function of a predetermined requirement for said fat signal;
- operate the MR scanner to radiate an RF preparation pulse, having said flip angle, from said RF coil arrangement;
- operate said MR scanner to radiate a Spectrally Adiabatic Inversion Recovery (SPAIR) pulse from said RF coil arrangement, after radiating said RF preparation pulse having said flip angle;
- operate said RF coil arrangement and said gradient coil system of said MR scanner to acquire another set of MR data, again comprising said fat signal, from said examination subject, and enter the acquired MR data into an electronic memory; and
- make the MR data stored in said electronic memory available in electronic form as a data file.

* * * * *